(12) United States Patent
Suzuki et al.

(10) Patent No.: US 8,312,626 B2
(45) Date of Patent: Nov. 20, 2012

(54) MANUFACTURING METHOD FOR PROBE CONTACT (75) Inventors: Takeyuki Suzuki, Kanagawa (JP); Ryo Ujike, Kanagawa (JP); Yoshinori Wakabayashi, Chiba (JP)

(73) Assignee: Yamaichi Electronics Co., Ltd., Ohta-Ku, Tokyo (JP)

( * ) Notice: Subject to any disclaimer, the term of this patent is extended or adjusted under 35 U.S.C. 154(b) by 547 days.

(21) Appl. No.: 12/516,155

(22) PCT Filed: Sep. 2, 2008

(86) PCT No.: PCT/JP2008/002396
§ 371 (c)(1),
(2), (4) Date: May 22, 2009

(87) PCT Pub. No.: WO2009/034693
PCT Pub. Date: Mar. 19, 2009

(65) Prior Publication Data
US 2010/0050431 A1  Mar. 4, 2010

(30) Foreign Application Priority Data
Sep. 10, 2007 (JP) ................................. 2007-234091

(51) Int. Cl.
*H01R 43/04* (2006.01)

(52) U.S. Cl. .................. 29/882; 29/413; 29/827; 29/874

(58) Field of Classification Search ................... 29/882, 29/412, 413, 827, 850, 874; 174/250, 255, 174/260
See application file for complete search history.

(56) References Cited

U.S. PATENT DOCUMENTS

| 6,946,375 B2 | 9/2005 | Hattori et al. |
| 7,087,501 B2 | 8/2006 | Hattori et al. |
| 7,162,794 B2 * | 1/2007 | Sakai et al. ..................... 29/832 |
| 2008/0121906 A1 | 5/2008 | Yakushiji |

FOREIGN PATENT DOCUMENTS

| JP | 8-15318 A | 1/1996 |
| JP | 2002-286755 A | 10/2002 |
| JP | 2006-86516 A | 3/2006 |
| JP | 2006086516 A | 3/2006 |
| JP | 2007-003263 A | 1/2007 |
| JP | 2007003263 A | 1/2007 |

OTHER PUBLICATIONS

International Preliminary Report on Patentability, Written Opinion, PCT/JP2008/002396, Issuance date Mar. 30, 2010.
International Search Report issued Nov. 25, 2008 in PCT/JP2008/002396.

* cited by examiner

*Primary Examiner* — Thiem Phan
(74) *Attorney, Agent, or Firm* — Banner & Witcoff, Ltd.

(57) ABSTRACT

To make the fracturing position controlled conveniently with high precision when the substrate end of the probe contact is fractured and cut off.

By compressing the front face of the substrate end portion with the pushing member, brittle fracture is generated on the substrate along the carved groove, and the substrate end portion is cut off from the substrate. The fracturing position in the above-mentioned fracturing is controlled so as to be along the fracturing position whose extension puts thereon the stress concentrating ends of two fracturing control structures. Here, the fracturing control structure is located with high positional precision on the front face of the substrate through the alignment technique of photolithography. In this way, resilient armatures constituted of the tips projected from the fracturing position coming to be the end of the substrate 11*a* can be stably formed with high precision.

13 Claims, 10 Drawing Sheets

MANUFACTURING METHOD FOR PROBE CONTACT

TECHNICAL FIELD

The present invention relates to a manufacturing method for a probe contact to carry out the energizing test for semiconductor devices, display panels, etc., and particularly relates to a manufacturing method for a probe contact capable of corresponding to electrodes developing into those with a minute pitch of a test substance without difficulty and effectively.

BACKGROUND ART

Recently, electrodes for terminals arranged in a test substance such as electronic device substrates for semiconductor integrated circuits and flat panel displays (FPD), or circuit substrates have a tendency to have the pitch thereof becoming minute more and more. Therefore, a probe contact having a minute pitch corresponding to the pitch of these electrodes is required for the side of the energizing test equipment in the energizing test of these electronic devices and circuit substrates.

As a method for manufacturing a probe contact having a minute pitch, the manufacturing method for a probe contact has been disclosed in which leads of an elongated conductive layer are formed on a plane front face of the substrate for contact arranged as far as the end of the substrate by the micro fabrication technology using photolithography, and then a predetermined region of the end of the substrate is cut off in such a manner that the tips of the leads can project from the edge of the substrate (For example, refer to the Patent Literature 1). The cutting method disclosed in the Patent Literature 1 has proposed that a carved groove is formed on the rear face of the edge of the substrate in order that the tips of the leads may come to be resilient armatures projected from the end of the substrate for contact and thereafter the edge of the substrate is fractured along the carved groove. However, this method may give damage such as deformation to the lead when the substrate is fractured.

Consequently, a manufacturing method for a probe contact was proposed to prevent the lead from being damaged when the substrate for contact is fractured (For example, refer to the Patent Literature 2). In this method, the sacrifice layer is formed on a region at the edge of the plain front face of the substrate, and the leads whose tips are positioned on the sacrifice layer are formed by the micro fabrication technology using photolithography, and further a groove passing just under the portion formed on the sacrifice layer of the lead is formed on the rear face of the substrate. Then, the sacrifice layer is removed after the lead is formed, and thereafter the substrate is to be fractured along the groove.

However, the method of fracturing the substrate for contact is prone to generate dispersion with respect to the fracturing position of the front face side at the end of the substrate after it is fractured. The reason is that though it is indispensable to align the groove in compliance with the position of the lead on the front face of the substrate or the position of the sacrifice layer at the process of forming the groove on the rear face of the substrate, dispersion inevitably occurs at this alignment. Furthermore, dispersion of the fracturing position on the substrate is affected by the practice of compressing when it is fractured. In some cases, the fracturing position does not go along the direction of the groove formed in a predetermined region of the rear face of the substrate elongated linearly, but may meander.

Dispersion of the fracturing position is directly connected to dispersion of the length of the resilient armature, and is greatly affected to the quantity of resilient bending and rubber elasticity. As a result, it varies the contact pressure to the electrode for the terminal of the test substance. Additionally, meandering of the fracturing position causes unevenness of the contact pressure over a plurality of leads. If the fracturing position is out of the proper region and does not clear the product specification in manufacturing of the probe contact, the probe contact comes to be defective and production yield thereof is decreased. Such dispersion of the fracturing position including meandering is a problem that comes to be obvious as the above-mentioned electrodes are developing into those with a minute pitch and thereby the lead thereof comes to be fine.

Though it is conceivable that the thickness of the substrate is reduced as a measure to solve the problems mentioned above, unevenness of the contact pressure over a plurality of leads due to undulation or warp of the substrate is on the contrary actualized in this case.

Patent Literature 1: Laid-Open Patent No. H08-15318
Patent Literature 2: Laid-Open Patent No. 2007-3263

DISCLOSURE OF INVENTION

Technical Problem

The present invention is carried out in view of the circumstances described above and is aimed principally at being able to control easily the fracturing position with high precision in order that the tip of the lead may be projected stably by an appropriate length from the end of the substrate so that it comes to be a resilient armature in the process where a groove is formed on the rear face of the end of the substrate for probe contact, thereafter the end portion of the substrate is fractured along the groove and cut off. The present invention is also aimed at providing a manufacturing method for a probe contact capable of corresponding to electrodes developing into those with a minute pitch of the test substance upon being able to reduce dispersion of the fracturing position on the front face side of the substrate for contact without difficulty.

Solution to Problem

To achieve the purpose mentioned above, a manufacturing method for a probe contact comprises the steps of; arranging, on a front face of a substrate, a plurality of leads in parallel in order that tips thereof may be positioned on a sacrifice layer formed on a part of the front face, forming a carved groove passing just under the sacrifice layer, fracturing the substrate along the carved groove after the sacrifice layer is removed and cutting off a part thereof, and projecting the tip of the lead from an end portion of the remaining substrate, wherein the manufacturing method for a probe contact further comprises forming a fracture controlling structure to give locally the front face of the substrate a stress at a position pinching the plurality of leads from both sides thereof on the front face of the substrate, and controlling a position of fracture of the substrate by the fracture controlling structure.

In the invention mentioned above, the fracture controlling structure is formed in a shape of a predetermined pattern on the front face of the substrate and a side of the pattern is aligned with the sacrifice layer. In a favorable embodiment of the present invention, the fracture controlling structure is formed in concurrence with positioning of the lead and is constituted of a material equal to the lead.

Advantageous Effect of Invention

By the configuration of the present invention, when the end portion of the substrate of the probe contact is fractured and cut off, the fracturing position thereof can be easily controlled with high precision, so that the tip of the lead can be stably formed as an appropriate resilient armature. Therefore, a probe contact corresponding effectively to the electrodes developing into those with a minute pitch for the terminals of the test substance for energizing test can be easily produced with a low cost.

REFERENCE SIGNS LIST 11, 11a: substrate, 11b: substrate end, 12: front face, 13: sacrifice layer, 13a: pattern side, 14: lead, 14a: tip portion, 14b: root end, 15: adhesive layer, 16: fracturing control structure, 16a: stress concentrating end, 17: carved groove, 17a: groove end, 18: pushing member, 19: fracturing position, 20: fractured surface, 161: another fracturing control structure

DESCRIPTION OF EMBODIMENTS

Some embodiment of the present invention will be explained hereafter referring to the drawings. The same or similar portions together are denoted by the common sign and overlapping explanation will be omitted. Figures are so schematic that the ratio of measures etc. is different from the actual one. FIG. 1 to FIG. 6 are plan views and cross sectional views thereof showing each manufacturing process of one example of the manufacturing method for a probe contact relating to the present invention. Here, each cross sectional view is the one observed from the direction of the X-X arrow or the Y-Y arrow described in the corresponding plan view.

Figure 1:
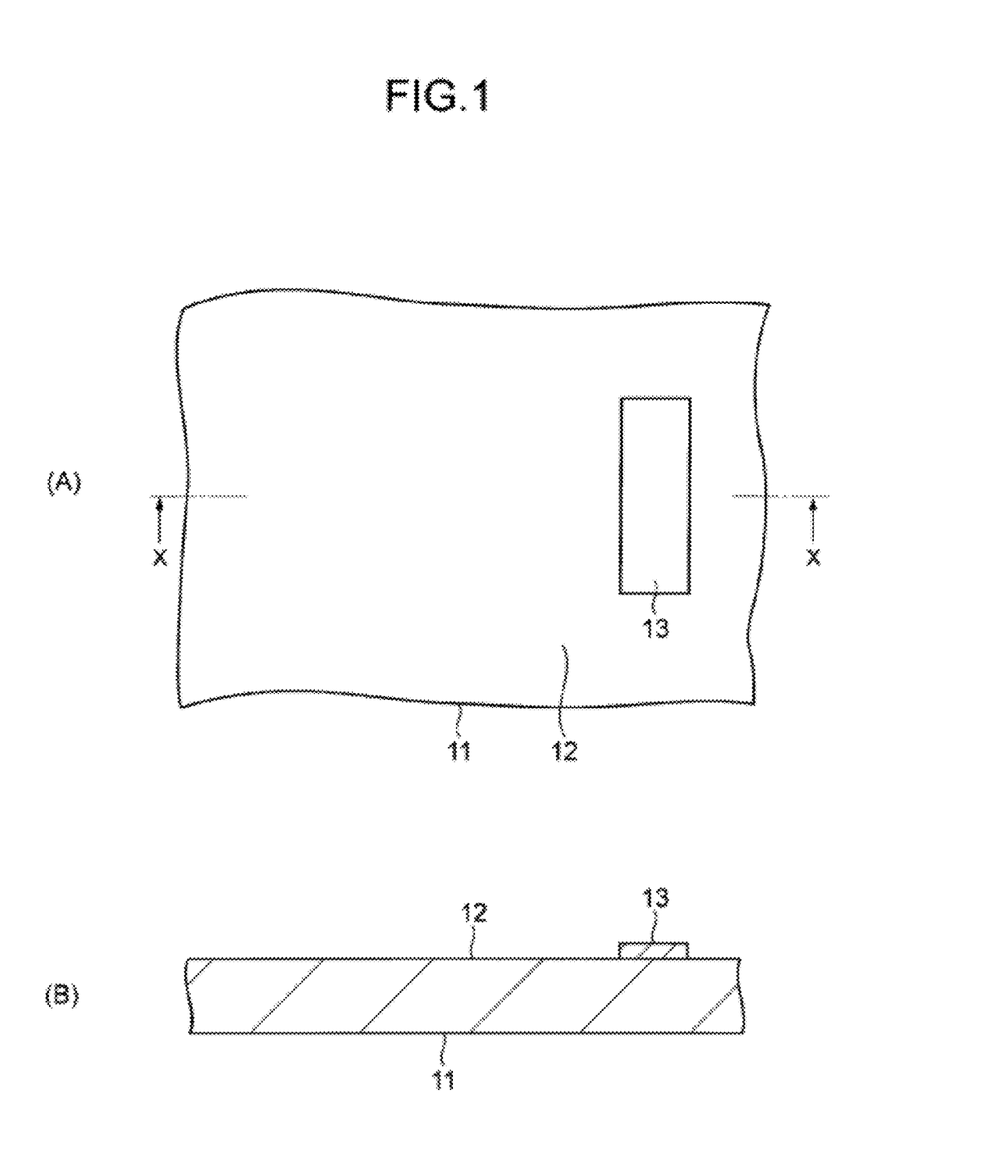
FIG. 1 is the first process chart explaining the fabricating method of the probe contact relating to an embodiment of the present invention, where (A) is a plan view and (B) is a cross sectional view of X-X line observed from the arrows.

First of all, as shown in FIG. 1, a sacrifice layer 13 is formed on a plain front face 12 of a substrate 11 for fabricating a plurality of probe contact products by one sheet. Here, the substrate 11 is constituted of a material capable of brittle fracture with the thickness of several hundred μm, such as zirconia, alumina, glass, or silicon. The sacrifice layer is constituted of e.g. a cupper (Cu) film with the thickness of several ten nm or more, preferably 100 nm or more, and fabricated in a desired number on a predetermined region (not shown) of the substrate 11 by e.g. the selective deposition of the required pattern by, for example, the etching process employing photolithography after deposition of a thin cupper film or the lift-off method.

When the sacrifice layer 13 is formed by the lift-off method, a resist pattern having an opening whose cross section is inversely tapered is formed on the front face 12 of the substrate 11 by photolithography. Then, the sacrifice layer is deposited by sputtering on the front face of the substrate 11 in the opening, and the resist pattern is to be removed together with the sacrifice layer thereon.

Figure 2:
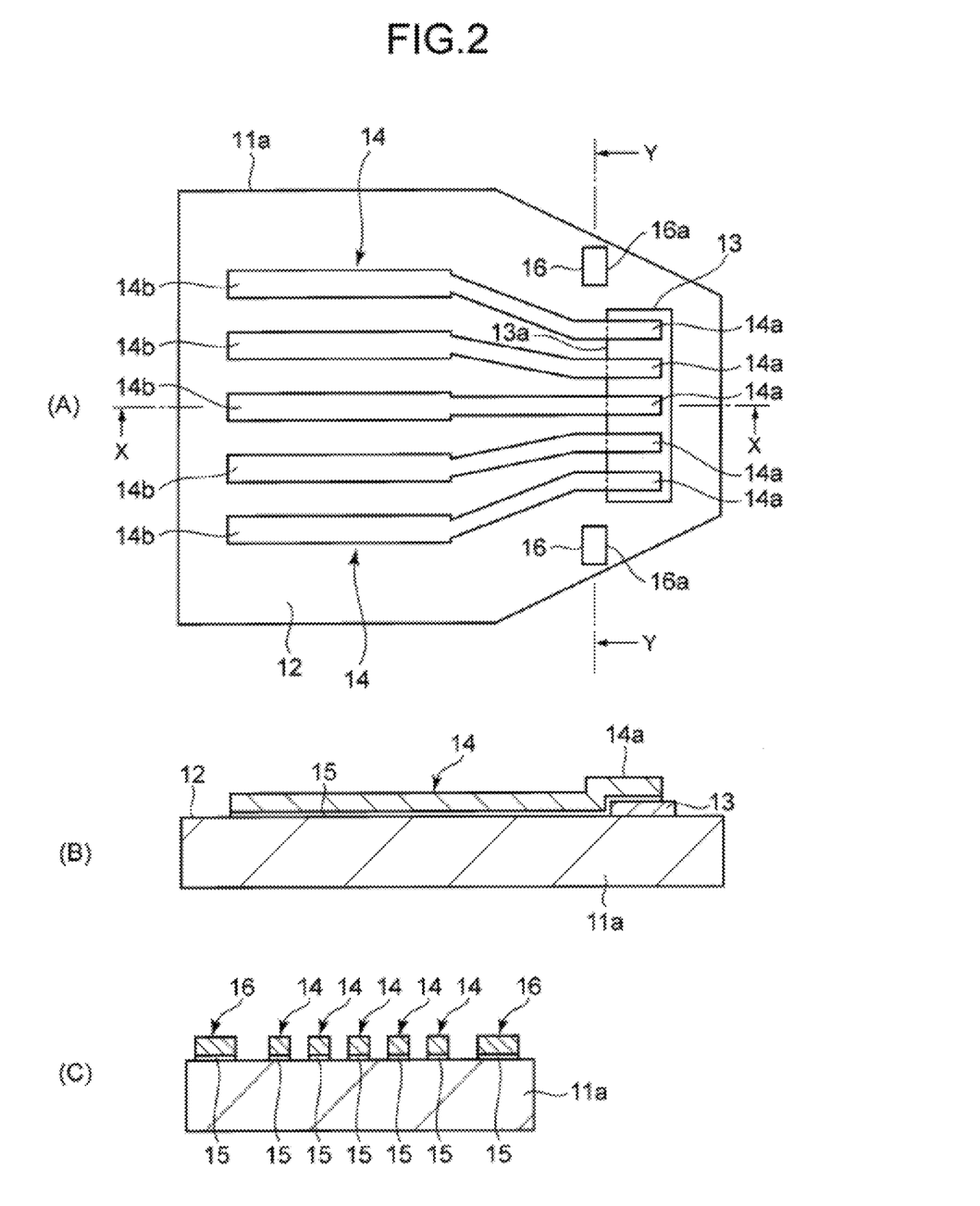
FIG. 2 is the second process chart explaining the fabricating method of the probe contact relating to an embodiment of the present invention, where (A) is a plan view; (B) is a cross sectional view of X-X line observed from the arrows; and (C) is a cross sectional view of Y-Y line observed from the arrows.

As shown in FIG. 2, necessary number (five in this embodiment) of leads 14 arranged on the front face 12 of the substrate 11a at a pitch corresponding to the electrodes for terminals of the test substance are prepared by pattern formation. Here, the lead 14 is constituted of e.g. nickel (Ni) alloy and preferably formed by lamination on an adhesion layer 15 deposited on the front face 12 of the substrate 11a. As the adhesion layer 15, a metallic material having a strong adhesive force to the substrate 11a of e.g. titanium (Ti), chromium (Cr) is desirable. The required number of leads 14 laminated on each adhesion layer 15 have the pitch of the tip portions 14a thereof made narrower than the pitch of the root ends 14b, and are positioned on the sacrifice layer 13 with a minute pitch corresponding to the electrodes for terminals of the test substance so as to be arranged like a beam.

The lead 14 has the thickness of several ten μm (e.g. 20 μm), and the width of the tip portion 14a is several ten μm (e.g. 10 μm). The root end portion 14b has made several ten μm (e.g. 20 μm) in width, and is connected with e.g. a flexible circuit board via solder, an anisotropic conductive film (ACF), or a bump so as to be connected electrically to an energizing test device.

In conjunction with the lead 14 mentioned above, for example, two fracturing control structures 16 are arranged on predetermined positions which interpose together the group of the beam-like tip portions 14a from both sides thereof. Though details thereof will be explained later, the stress concentrating end 16a that is one straight-line side of the rectangular fracturing control structure 16 as shown in the figure is arranged to be aligned on e.g. the extension of the pattern side 13a of the sacrifice layer 13.

Specifically, the adhesive film coming to be the adhesive layer 15 later is first formed by sputtering on the front face 12 of the substrate 11 explained in FIG. 1. Then, the resist pattern for required plating is formed on the adhesive film by photolithography. The resist pattern has the opening pattern corresponding to each of the leads 14 and the opening pattern of the fracturing control structure 16. These opening patterns are formed in alignment with the pattern of the sacrifice layer 13 by the alignment method between different layers well-known in photolithography. The opening pattern of the fracturing control structure 16 formed like the above is aligned on the position of the sacrifice layer 13 with high precision.

Thereafter, a plating layer is deposited on the adhesive film in the opening of these resist patterns by electrolytic plating. The adhesive film acts as a feeding layer here. Then, the resist pattern after plating is removed and the exposed part of the adhesive film is removed by e.g. etching. After the processes mentioned above, a plurality of substrates 11a in the required shape are carved out from the substrate 11 by dicing, sand blast, laser machining, etc.

For formation of the leads 14 and the fracturing control structure 16, the lift-off method explained in the formation process of the sacrifice layer 13 can be used. Furthermore, the leads 14 and the fracturing control structure 16 can also be formed by deposition of the above-mentioned various metallic films and processing of these metallic films by means of photolithography.

Whatever the case may be, the fracturing control structure 16 formed herewith has far high precision and small dispersion compared to aligning the groove in alignment with the position of the leads or the position of the sacrifice layer on the front face of the substrate explained in the conventional technology, so that it can be positioned at a predetermined position of the substrate 11a.

Figure 3:
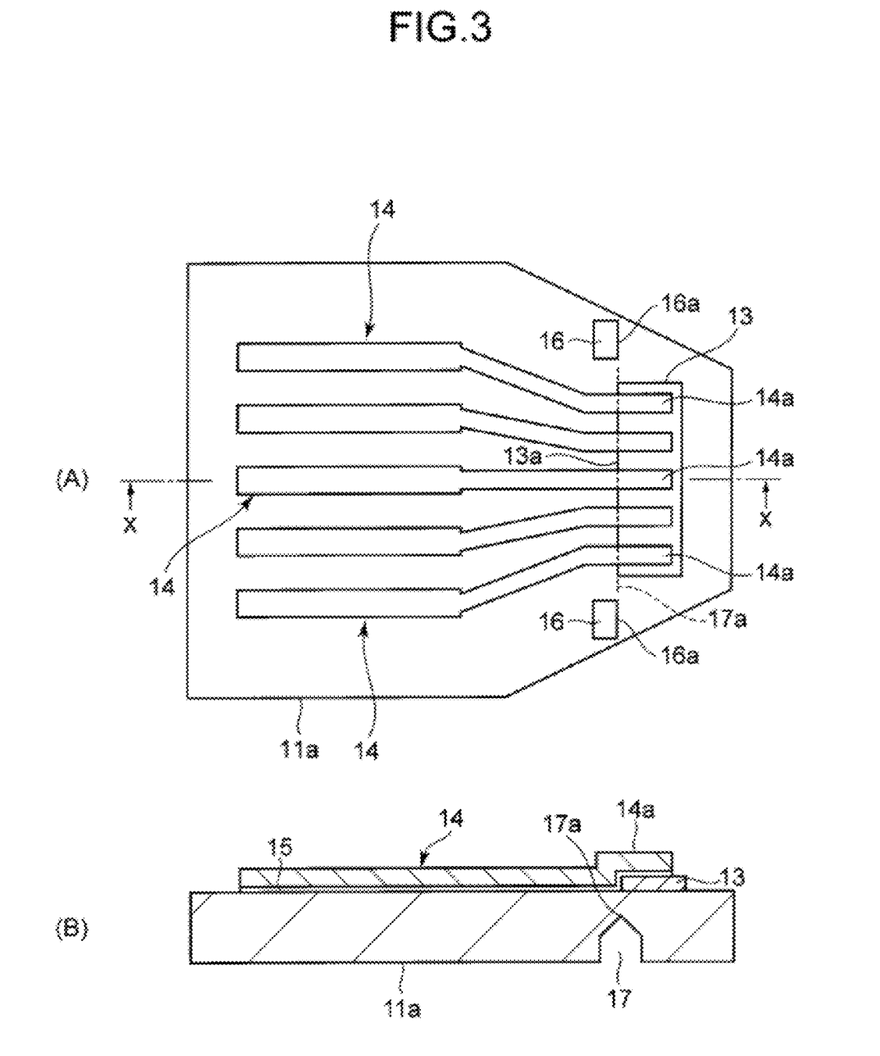
FIG. 3 is the third process chart explaining the fabricating method of the probe contact relating to an embodiment of the present invention, where (A) is a plan view and (B) is a cross sectional view of X-X line observed from the arrows.

Then, the carved groove 17 lengthening linearly in the predetermined range of the rear face of the substrate 11a is formed as shown in FIG. 3. This carved groove 17 has the line width of several tens to several hundreds μm and the depth of several tens μm in light of the thickness of the substrate 11a. Here, the groove end 17a of the carved groove 17 in the direction of depth is located between the stress concentration ends 16a of two fracturing control structures 16, and elongated in e.g. the direction substantially normal to the direction in which the leads are arranged. It is favorable that the carved groove should be formed in such a manner as to be approximately just under the pattern side 13a of the sacrifice layer 13.

Specifically, the carved groove 17 is formed by dicing, sandblast, laser machining, etc. of the rear face of the substrate 11a aligned with the sacrifice layer 13 on the front face side of the substrate 11a or the fracturing control structure 16. Alternatively, the carved groove can be fabricated by highly anisotropic dry etching of the rear face of the substrate 11a, using the deep reactive ion etching (DRIE) of high density plasma (HDP) like inductively coupled plasma (ICP).

Figure 4:
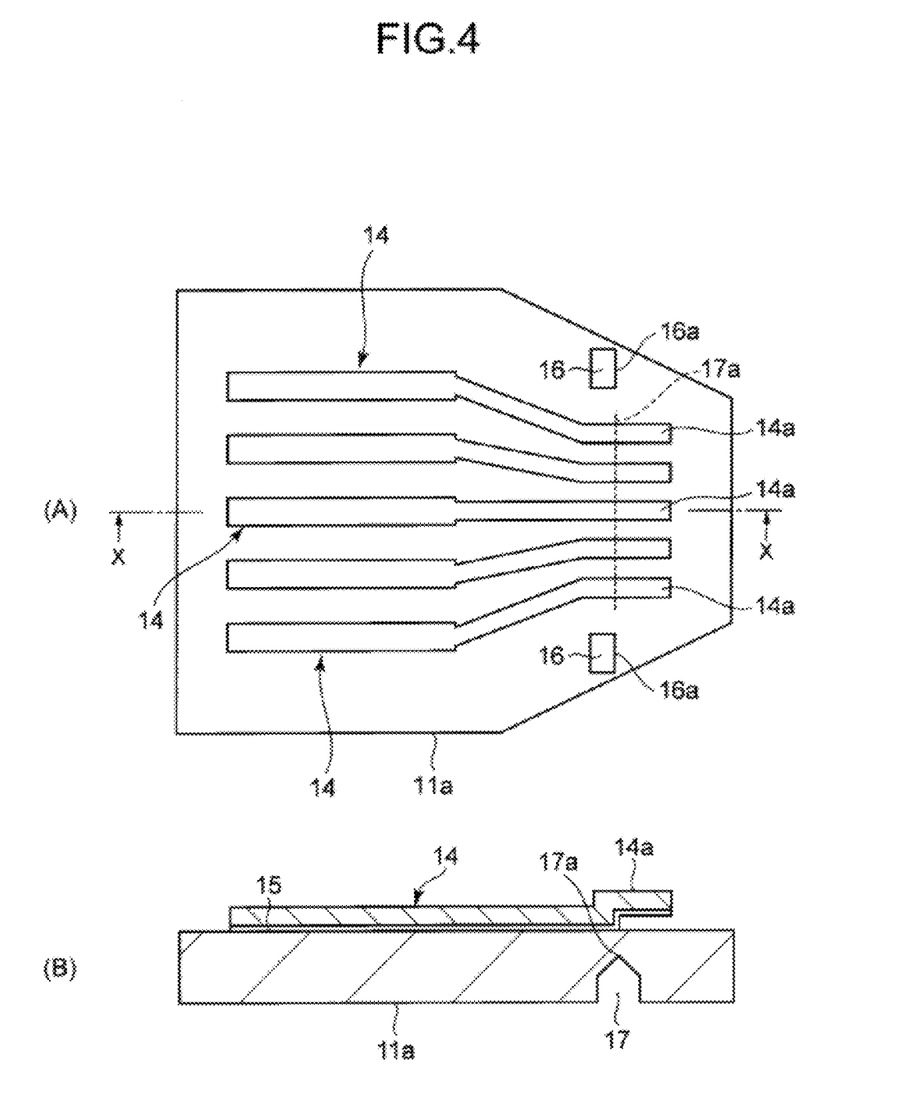
FIG. 4 is the fourth process chart explaining the fabricating method of the probe contact relating to an embodiment of the present invention, where (A) is a plan view and (B) is a cross sectional view of X-X line observed from the arrows.

As shown in FIG. 4, the sacrifice layer 13 constituted of cupper thin film is removed by using an etching liquid such as iron chloride dissolving selectively the sacrifice layer 13. By removing the sacrifice layer 13, the tip 14a of the lead 14 formed on the sacrifice layer 13 is floated and detached from the front face 12 of the substrate 11a.

Figure 5:
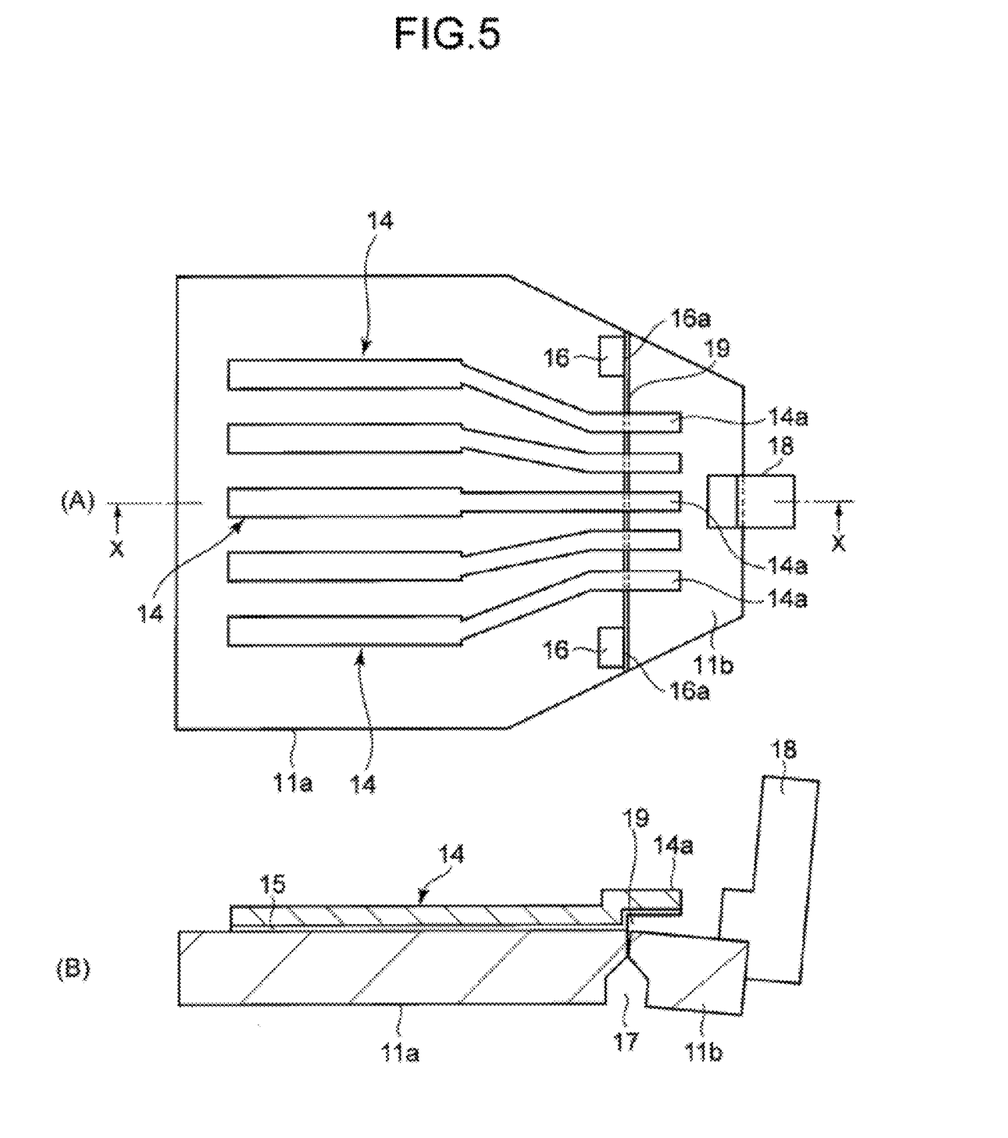
FIG. 5 is the fifth process chart explaining the fabricating method of the probe contact relating to an embodiment of the present invention, where (A) is a plan view and (B) is a cross sectional view of X-X line observed from the arrows.
Figure 6:
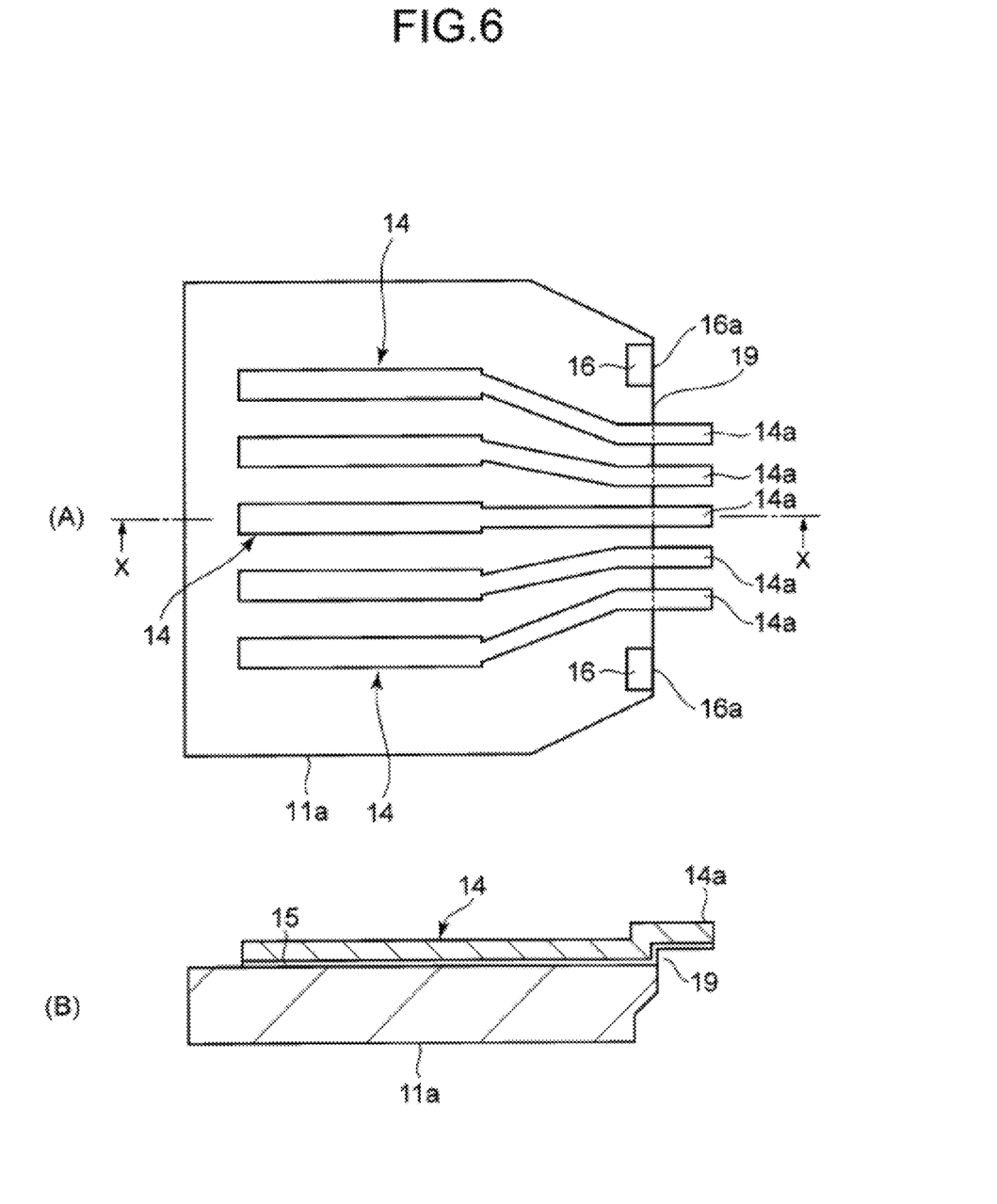
FIG. 6 is the sixth process chart explaining the fabricating method of the probe contact relating to an embodiment of the present invention, where (A) is a plan view and (B) is a cross sectional view of X-X line observed from the arrows.

As shown in FIG. 5 and FIG. 6, the substrate 11a is fractured along the carved groove 17 and the substrate end portion 11b is removed from the substrate 11a. Specifically, brittle fracture is carried out by compressing the front face of the substrate end portion 11b by means of e.g. a pushing member 18 as shown in FIG. 5. Alternatively, brittle fracture of the substrate 11a may be carried out on the contrary by compressing the rear face of the substrate end portion 11b.

The substrate end portion 11b is cut off from the substrate 11a by fracturing like this along the fracturing position 19 whose extension puts thereon the stress concentrating ends 16a of two fracturing control structures 16. As shown in FIG. 6, the resilient armature group constituted of the tips 14a projecting by e.g. several hundreds μm long from the fracturing position 19 coming to be the end of the substrate 11a is fabricated.

According to the fracturing method mentioned above of the substrate 11a, dispersion of the fracturing position 19 on the front face side thereof is remarkably reduced, so that accurate and high-precision fracturing and cut-off along the objective line can be carried out. In the embodiment described above, the objective line of the fracturing was set to be the pattern side 13a of the sacrifice layer 13, but the objective line can be arbitrarily changed by the located position of the stress concentrating ends 16a of the above-mentioned two fracturing control structures 16. Moreover, the fracturing position 19 can be in the region where the leads 14 are floated and detached from the front face of the substrate 11a, so that no damage such as deformation is given to the leads 14 when the fracturing is carried out.

Figure 7:
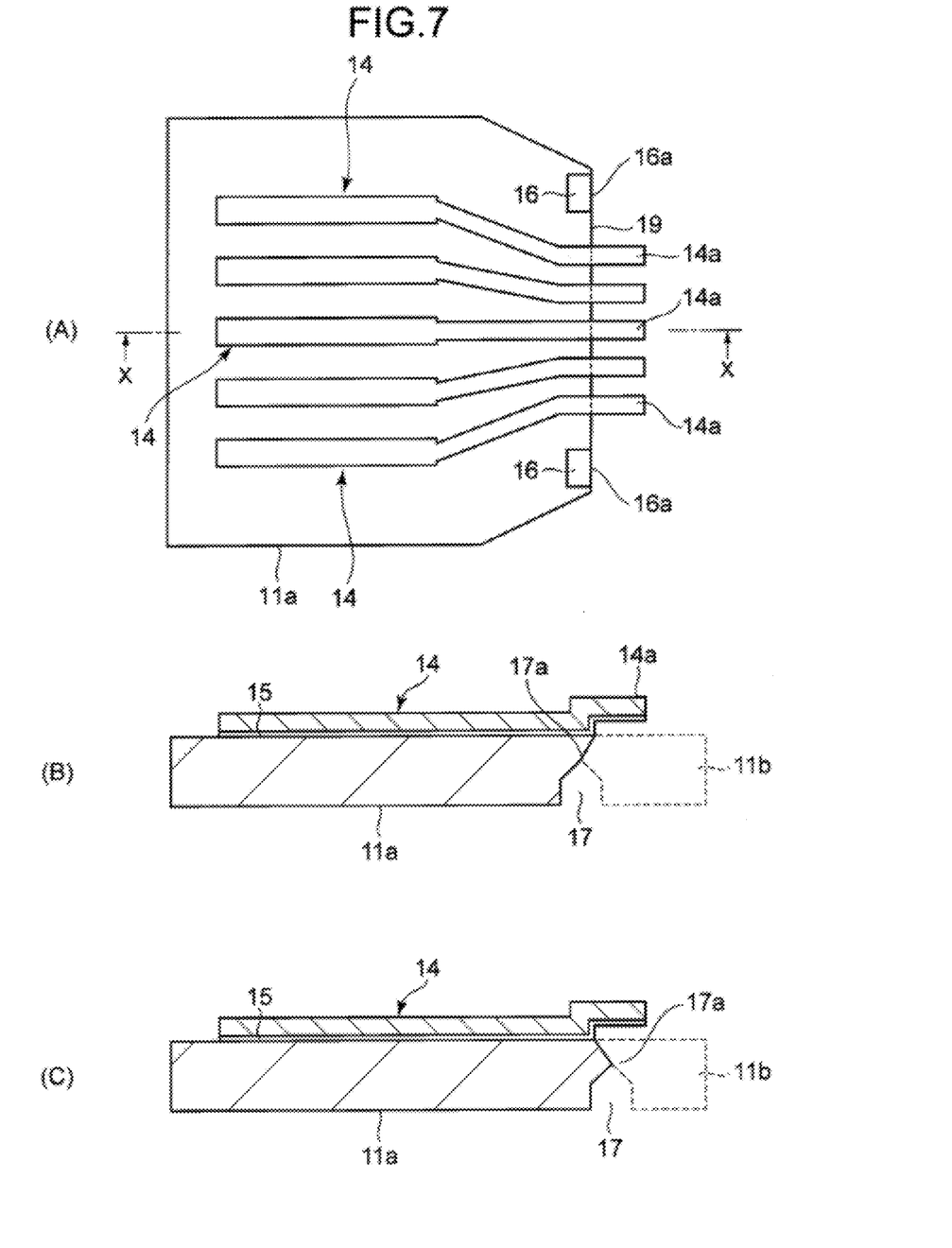
FIG. 7 is a diagram of a probe contact explaining the effect in an embodiment of the present invention.
Figure 8:
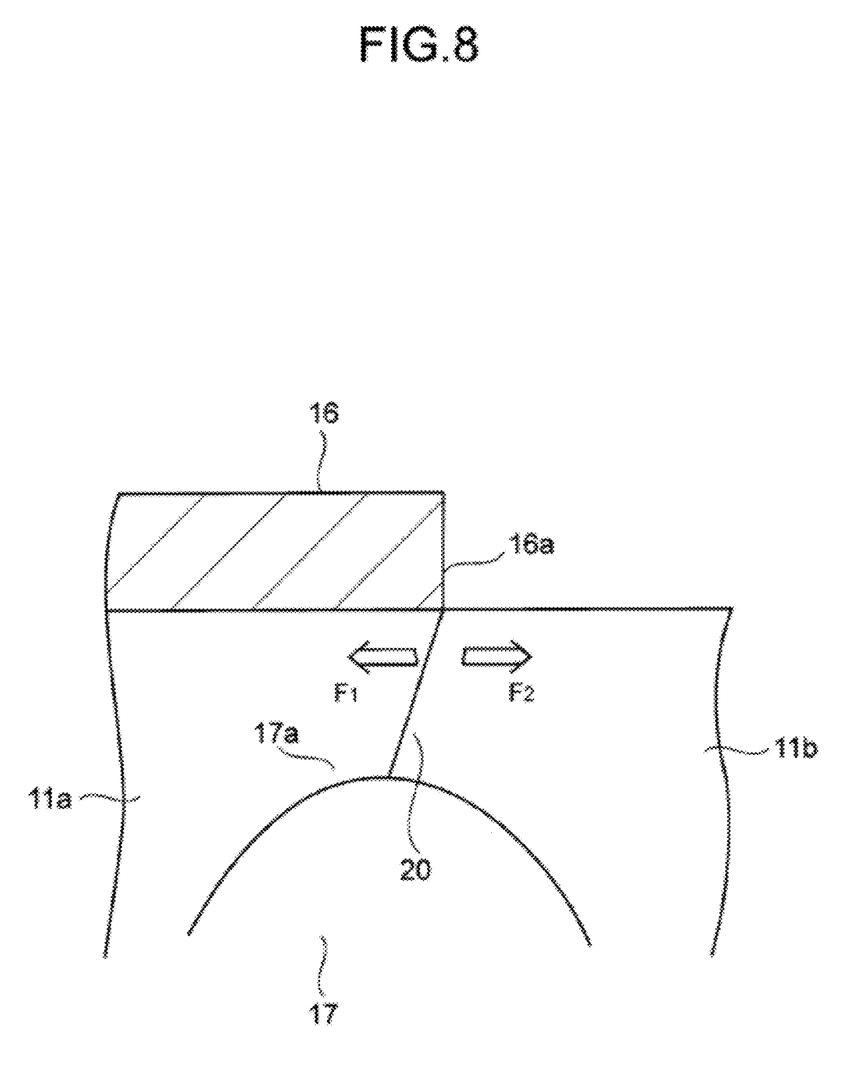
FIG. 8 is a schematic cross sectional view explaining the effect of a fracturing control structure on the front face of the substrate in an embodiment of the present invention.

In the next place, action and effects to which the stress concentrating end 16a of the fracturing control structure 16 works well during the fracturing of the substrate 11a will be explained referring to FIG. 7 and FIG. 8. FIG. 7(A) is a plan view of the probe contact after the substrate end portion 11b is cut off by fracturing of the substrate 11a, and FIGS. 7(B) and (C) are cross sectional views of FIG. 7(A) observed from the arrows X-X. FIG. 8 is a schematic cross sectional view for explaining action of the fracturing control structure 16 on the front face of the substrate during fracturing of the substrate 11a.

As shown in FIG. 7(A), the fracturing position 19 on the front face of the substrate 11a is forced to conform along the pattern side 13a of the embodiment mentioned above by the aid of the stress concentrating ends 16a of the two fracturing control structures 16 if the groove end 17a of the carved groove 17 deviates in the left direction on the paper of the figure from the pattern side 13a of the sacrifice layer 13 when the carved groove 17 is positioned. In the same way, even if the groove end 17a of the carved groove 17 deviates in the right direction on the paper of the figure this time at the above-mentioned positioning as shown in FIG. 7(B), the fracturing position 19 on the front face of the substrate 11a is forced by the stress concentrating ends 16a of the two fracturing control structures 16 and is set to be along the pattern side 13a in the embodiment mentioned above. Like the above, the stress concentrating ends 16a of the two fracturing control structures 16 control in such a manner that the fracturing position 19 may located at an appropriate position even if positioning of the carved groove is deviated.

Controlling of the fracturing position by the fracturing control structure 16 shown in FIG. 7 is generated by a local stress which is given to the front face of the substrate 11a by the stress concentrating end 16a of the fracturing control structure 16. For example, as shown in FIG. 8, when the fracturing control structure 16 gives a compression stress to the front face of the substrate 11a, the region of the front face on which the fracturing control structure 16 is formed receives the compression stress and the front face of the substrate 11a, especially the vicinity of the stress concentrating end 16a, on which the fracturing control structure is not formed, receives a large tension stress $F_1$ on the contrary.

When a compression force by the pushing member 18 as is explained in FIG. 5 is added on the front face of the substrate end portion 11b here, a large tension stress $F_2$ thereby to the front face of the substrate 11a is added. By the tension stress $F_1$ and the tension stress $F_2$ inverse to each other, fracturing yield in the substrate material occurs between the stress concentrating end 16a and the carved groove 17, especially the groove end 17a, so that the brittle fractured surface 20 is to be formed without difficulty.

Though it is not shown in the figure, when the fracturing control structure 16 gives inversely the tension stress to the front face of the substrate 11a, the region of the front face on which the fracturing control structure 16 is formed receives this tension stress and the front face of the substrate 11a, especially the vicinity of the stress concentrating end 16a, on which the fracturing control structure is not formed, receives a large compression stress. When the rear face of the substrate end portion 11b is compressed on the contrary this time, compression stress due to this compression synergizes in the vicinity of the stress concentrating end 16a on the front face of the substrate end portion 11b, and thereby, tension stress of the carved groove 17 on the rear face side increases. As a result, formation of a brittle fracturing surface comes to be facilitated between the stress concentrating end 16a and the carved groove 17, especially the groove end 17a.

Because the stress concentrating end 16a of the fracturing control structure 16 determines the fracturing surface by stress concentration on the front face of the substrate 11a in all cases described above, the fracturing position is forced to the stress concentrating spot and controlled. When compression is carried out from the front face side, damage can be avoided because the fractured substrate end 11a does not hit the lead tip portion 14a.

Thus, even if deviation of positioning for the carved grooves 17 in conformity with the position of the lead 14 or the position of the sacrifice layer 13 on the front face of the substrate 11a occurs inevitably in the process of forming the carved groove 17 on the rear face of the substrate 11a, the fracturing position 19 is controlled so as to be a certain appropriate position by the stress concentrating end 16a of the fracturing control structure 16. Furthermore, deviation of the fracturing position due to the practice of compression during the fracturing by means of the conventional technology is remarkably decreased by controlling the stress concentrating end 16a. In addition, meandering of the fracturing position caused by the conventional technology can be cleared by controlling the stress concentrating end 16a.

In this embodiment, because the fracturing position on the front face side can be controlled easily so as to be the appropriate position when the substrate is cut off by fracturing, the projecting length of the resilient armature from the edge end of the substrate is stably controlled with high-precision. In consequence, the probe contact constituted of the resilient armature group, which is excellent in stability of the contact pressure and in repetition durability of contact, can be fabricated with a high production yield. As mentioned above, uniformity of the contact pressure over the leads of the resilient armature group is improved, and it can easily correspond to the electrodes developing into those with a minute pitch and to augmentation of the number of electrodes for the terminals of the test substance in the energizing test.

Though the stress concentrating end 16a, which is a side of the fracturing control structure 16, is positioned by e.g. aligning with the position of the sacrifice layer 13 with high precision, it is not restricted to a position on the extension of the pattern side 13a. The aligning position thereof can be arbitrarily changed in the pattern of the sacrifice layer 13.

Figure 9:
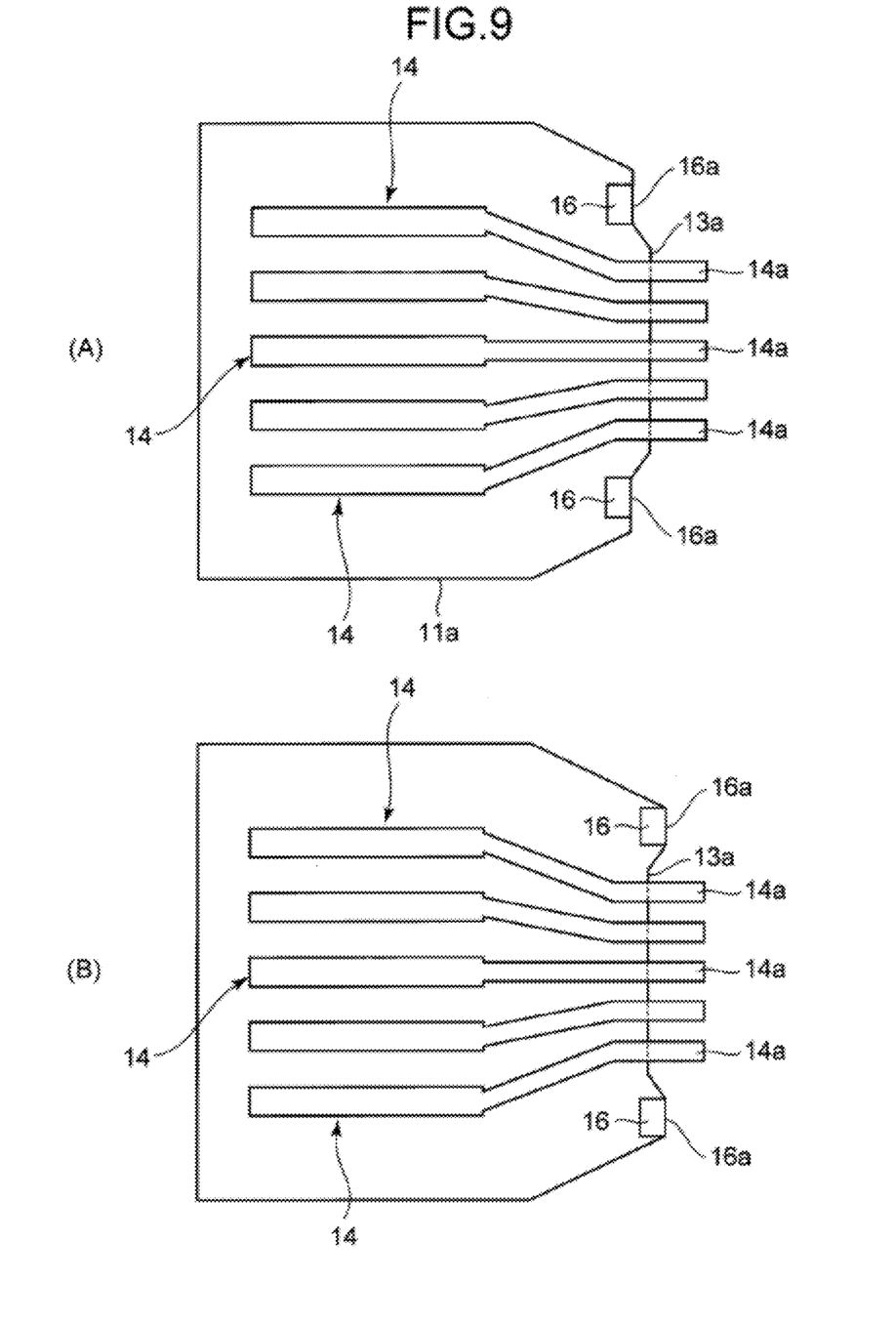
FIG. 9 is a plan view of a probe contact explaining another effect in an embodiment of the present invention.

The stress concentrating end 16a of the above-mentioned fracturing control structure 16 can also be used in the case of controlling the form of the edge end of the probe contact contingent on the located position on the front face of the substrate 11a. One example thereof will be explained referring to FIG. 9. FIG. 9 is a plan view of the probe contact after the substrate end portion of the substrate 11a is fractured and cut off.

For instance, the stress concentrating end 16a of the fracturing control structure 16 is located on the left side of the paper of the figure compared to the pattern side 13a of the sacrifice layer 13 in the case shown in FIG. 9(A). Here, the groove end 17a of the above-mentioned carved groove 17 is assumed to be e.g. approximately just under the pattern side 13a. If fracturing of the substrate 11a is carried out on the condition like this, the pattern side 13a on the front face of the substrate 11a comes to be the fracturing position because stress concentration of the lead 14 as explained by the stress concentrating end 16a occurs on the position of the pattern side 13a where the lead 14 is floated and detached from the front face of the substrate 11a. The fracturing position comes to be connected to the positions of the two stress concentrating ends 16a. As mentioned above, the probe contact whose edge end having the beam-like resilient armature group protruded therefrom bulges from the periphery thereof as shown in FIG. 9(A) can be conveniently fabricated.

In the case shown in FIG. 9(B), the stress concentrating end 16a of the fracturing control structure 16 is located on the right side of the paper of this figure compared to the pattern side 13a of the sacrifice layer 13. In this case, the groove end 17a of the carved groove 17 mentioned above is also assumed to be e.g. approximately just under the pattern side 13a. If fracturing of the substrate 11a is carried out on the condition like this, the pattern side 13a on the front face of the substrate 11a comes to be the fracturing position because stress concentration of the lead 14 as explained by the stress concentrating end 16a occurs on the position of the pattern side 13a where the lead 14 is floated and detached from the front face of the substrate 11a. The fracturing position comes to be connected to the positions of the two stress concentrating ends 16a. As mentioned above, the probe contact whose edge end having the beam-like resilient armature group projected therefrom dents from the periphery thereof as shown in FIG. 9(B) can be conveniently fabricated.

Figure 10:
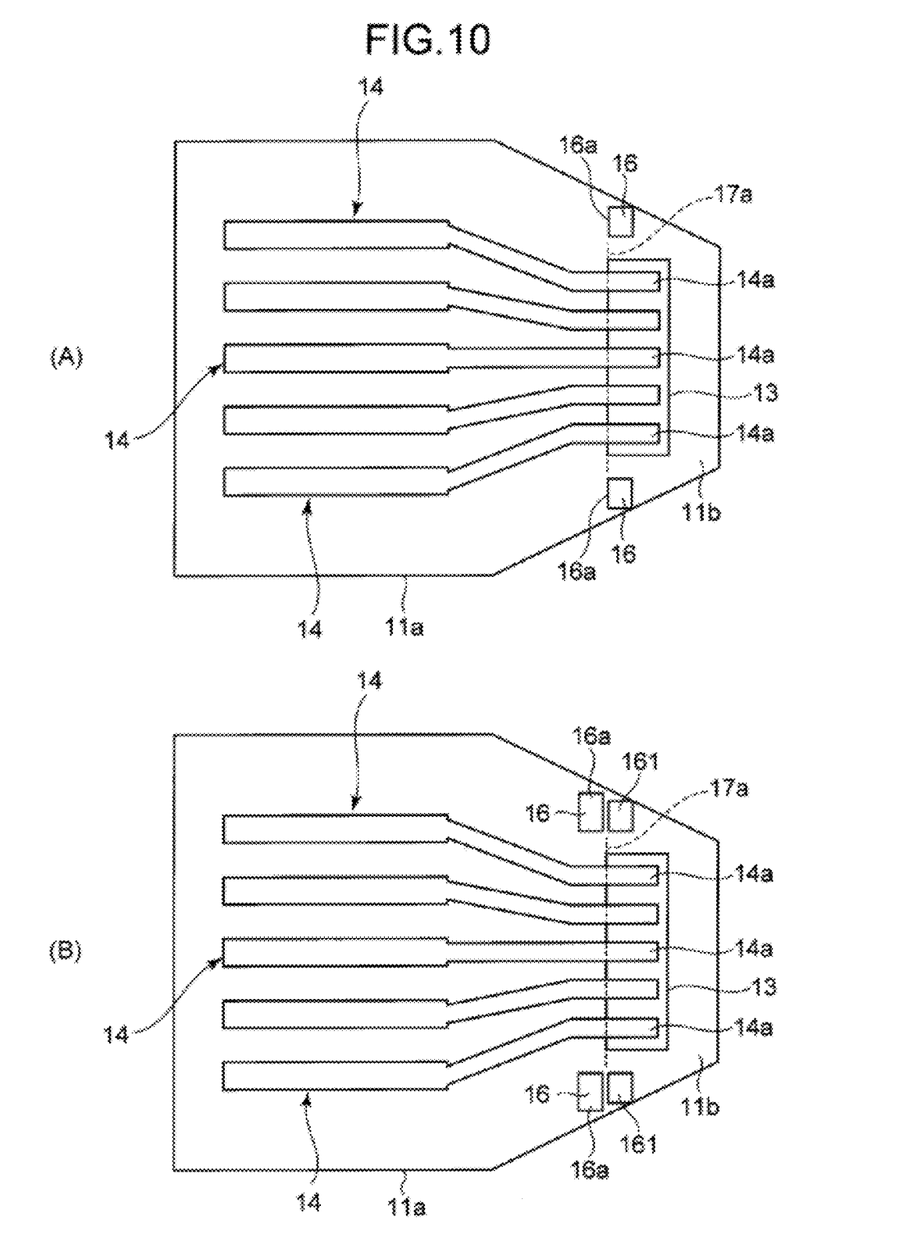
FIG. 10 is a plan view of a probe contact showing a modified example of an embodiment of the present invention.

A modified example of this embodiment will be explained next referring to FIG. 10. FIG. 10 is a plan view just the same as explained by FIG. 3, which is the case of the fracturing control structure 16 being located differently on the substrate 11a.

For instance, in the case shown in FIG. 10(A), the fracturing control structure 16 is located on the substrate end portion 11b side. Here, it is desirable that the groove end 17a of the carved groove 17 in the direction of depth should be located approximately just under the pattern side 13a of the sacrifice layer 13 between the stress concentrating ends 16a of the two fracturing control structures 16. Then, the fracturing control structure 16 is cut off together with the substrate end portion 11b and does not remain on the substrate 11a different from the case of the embodiment mentioned above, after the substrate 11a is fractured and cut off.

In the case shown in FIG. 10(B), two kinds of fracturing control structures are arranged face to face together. That is to say, another fracturing control structure 161 having a side that faces the stress concentrating side 16a of the fracturing control structure 16 as explained in the embodiment is located face to face, with e.g. the groove end 17a of the carved groove 17 being interposed. In the allocation like this, controllability of the fracturing position on the front face of the substrate 11a is further improved, so that cutting off the substrate 11a by stable fracturing can be performed.

The above-mentioned fracturing control structure 16 can also be located between adjacent leads 14.

Some favorable embodiments of the present invention have been explained hitherto, but the embodiments described above do not restrict the present invention. Those skilled in the art can add varieties of modifications or changes without any departure from the technological consciousness and the technological range in a specified embodiment.

For example, though the fracturing control structure 16 is formed with the same material in the same process as the lead 14 in the embodiment mentioned above, it can also be formed with a different material in a different process from those of the lead 14. The number of fabrication processes increases in this case, but the selecting range for the material of the lead 14 and the fracturing control structure 16 is expanded. Therefore, a material generating a large stress corresponding to the quality of material of the substrate 11*a* can be appropriately selected. For example, an insulative material can be selected as well as a metallic material. Competence of controlling the fracturing position for cut-off of the substrate explained in the embodiment can be further augmented.

The carved groove 17 formed on the rear face of the substrate 11*a* is not necessarily positioned just under the pattern side 13*a* of the sacrifice layer 13 formed on the front face of the substrate. The position can be appropriately selected. However, in consideration of preventing the lead 14 from being damaged e.g. deformed in fracturing of the substrate 11*a*, it is desirable that the position should be under the sacrifice layer 13 located where the lead 14 comes to be floated and detached from the front face of the substrate 11*a*.

In addition, forming the carved groove 17 on the substrate 11*a* is not restricted to the embodiments mentioned above, but can arbitrarily be carried out in the period between a time before forming the sacrifice layer 13 and a time after removing the etching thereof.

Moreover, the adhesion layer 15 between the substrate 11*a* and the lead 14 and the fracturing control structure 16 is not restricted to the embodiments mentioned above. It may be formed in a multi layer structure. If adhesiveness between the substrate 11*a* and the lead 14 and the fracturing control structure does not have any problems, the adhesion layer 15 is not indispensable.

What is claimed is:

1. A manufacturing method for a probe contact, comprising the steps of;
    arranging, on a front face of a substrate, a plurality of leads in parallel for tips thereof to be positioned on a sacrifice layer formed on a part of the front face,
    forming into a rear face a carved groove passing just under the sacrifice layer,
    fracturing the substrate along the carved groove and cutting off a removing part thereof after the sacrifice layer is removed, and
    projecting the tips of the leads from an end portion of a remaining substrate;
    forming a fracture controlling structure of a metallic or insulating material on the front face of the substrate to give locally the front face of the substrate a stress at a position pinching the plurality of leads from both sides thereof on the front face of the substrate, and
    controlling a position of fracturing on the substrate by the fracture controlling structure, and pushing the removing part from the side of the front face to fracture the substrate, wherein the fracturing does not break the fracture controlling structure.

2. The manufacturing method for a probe contact as set forth in claim 1, wherein the fracture controlling structure is formed in a shape of a predetermined pattern on the front face of the substrate and a side of the pattern is aligned with the sacrifice layer.

3. The manufacturing method for a probe contact as set forth in claim 2, wherein the fracture controlling structure is formed in concurrence with positioning of the leads and is constituted of a material equal to that of the leads.

4. The manufacturing method for a probe contact as set forth in claim 1, wherein the fracture controlling structure is formed in concurrence with positioning of the leads and is constituted of a material equal to that of the leads.

5. The manufacturing method for a probe contact as set forth in claim 1, wherein a stress concentrating end of the fracturing control structure is located in a direction far from the tips of the leads compared to a pattern side of the sacrifice layer.

6. The manufacturing method for a probe contact as set forth in claim 1, wherein a stress concentrating end of the fracturing control structure is formed on the tip side of the leads compared to a pattern side of the sacrifice layer.

7. The manufacturing method for a probe contact as set forth in claim 1, wherein the fracturing control structure comprises a first fracturing control structure having a stress concentrating end and a second fracturing control structure having a side face to face with the stress concentrating end, and is arranged face to face with each other, interposing the carved groove.

8. The manufacturing method for a probe contact as set forth in claim 7, wherein the groove end of the carved groove is located between the first and second fracturing control structures and positioned just under a pattern side of the sacrifice layer.

9. The manufacturing method for a probe contact as set forth in claim 1, wherein the fracturing of the substrate is carried out by pressure on the front face of the substrate.

10. The method of claim 1, wherein the fracture controlling structure includes a stress concentrating end that is parallel to and overlaps with an interior portion of the carved groove.

11. The method of claim 10, wherein controlling a position of fracturing includes causing a fracture to occur along the stress concentrating end of the fracture controlling structure, and without breaking the fracture controlling structure.

12. The method of claim 1, wherein in an edge-on cross-sectional view taken along an axis of the carved groove, the fracture controlling structure partially overlaps with, and does not completely cross, the carved groove.

13. The method of claim 1, wherein the fracture controlling structure includes parts on opposite sides of the plurality of leads, and wherein controlling the position of fracturing on the structure by the fracture controlling structure further comprises using the fracture controlling structure to guide a fracture to form in a line extending between the two parts of the fracture controlling structure.

* * * * *